(12) United States Patent
Koshita

(10) Patent No.: US 8,050,123 B2
(45) Date of Patent: Nov. 1, 2011

(54) SEMICONDUCTOR MEMORY DEVICE AND METHOD OF DEFECTIVE CELL TEST BY ADJUSTING A BITLINE REFERENCE/PRECHARGE LEVEL

(75) Inventor: Gen Koshita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 474 days.

(21) Appl. No.: 12/289,357

(22) Filed: Oct. 27, 2008

(65) Prior Publication Data

US 2009/0109763 A1 Apr. 30, 2009

(30) Foreign Application Priority Data

Oct. 29, 2007 (JP) ................................ P2007-280754

(51) Int. Cl.
*G11C 29/00* (2006.01)
(52) U.S. Cl. ... 365/201; 365/203; 365/208; 365/210.13; 365/230.06; 365/185.15; 365/189.07; 365/189.09
(58) Field of Classification Search .................. 365/202, 365/203, 201, 189.15, 189.07, 189.09, 207, 365/208, 210.13, 230.06
See application file for complete search history.

(56) References Cited

U.S. PATENT DOCUMENTS

| 6,452,855 | B1 * | 9/2002 | Hsu et al. ................. | 365/189.16 |
| 7,002,874 | B1 | 2/2006 | Parris et al. | |
| 7,349,278 | B2 * | 3/2008 | Min et al. ...................... | 365/222 |
| 7,619,939 | B2 * | 11/2009 | Kajitani ........................ | 365/203 |
| 7,675,767 | B2 * | 3/2010 | Takahashi ..................... | 365/149 |
| 2004/0246045 | A1 * | 12/2004 | Lim et al. ...................... | 327/540 |

FOREIGN PATENT DOCUMENTS

| JP | 2732762 | 12/1997 |
| JP | 2005-339590 | 12/2005 |
| JP | 2006-260735 | 9/2006 |

* cited by examiner

*Primary Examiner* — Andrew Q Tran
(74) *Attorney, Agent, or Firm* — McGinn IP Law Group, PLLC

(57) ABSTRACT

A semiconductor memory device simultaneously selects an object cell and a counter cell which connect with a common bit line, simultaneously activates sub-word lines of the object cell and the counter cell after predetermined levels are written in the object cell and the counter cell, simultaneously read data of the object cell and the counter cell from the common bit line, and hence, determines whether the object cell is normal or defective, based on a voltage level of the common bit line. Thereby, the defective cell in the semiconductor memory device can be reliably detected.

20 Claims, 12 Drawing Sheets

US 8,050,123 B2

SEMICONDUCTOR MEMORY DEVICE AND METHOD OF DEFECTIVE CELL TEST BY ADJUSTING A BITLINE REFERENCE/PRECHARGE LEVEL

BACKGROUND OF THE INVENTION

1. Field of the Invention

The present invention relates to a semiconductor memory device. More particularly, the present invention relates to a semiconductor memory device and a method of a defective cell test that can examine a precise detection test for the defective cell.

Priority is claimed on Japanese Patent Application No. 2007-280754, filed Oct. 29, 2007, the content of which is incorporated herein by reference.

2. Description of Related Art

In a dynamic random access memory (DRAM), the number of memory cells is too large to produce all memory cells completely. Therefore, there is a case in which a few memory cells have a poor storage capacitance due to production problems. For such memory cells having a defect, it is important to reliably detect the defect in a test process. If the defect can be detected, the defective cell can be exchanged for a cell with no defects. Even though the test process is performed after the exchanging process, a release of the rejected product can be prevented if a defect is detected.

An operation of the memory cell having a poor storage capacitance is described hereinafter for the case in which a word line is actually activated and data is output to a sense amplifier. FIG. 12 shows a timing chart in the case that a memory cell portion obtains an initial voltage of 0 V.

As shown in FIG. 12, when the word line is activated from 0 V (GND level) to a word voltage VPP, memory cell data is leaked to a bit line. In this case, since the defective cell has few cell capacitances and the quantity of electric charge is small, the bit line voltage of the defective cell is reduced slightly.

On the other hand, since a normal cell has a sufficiently large capacitance and the quantity of electric charge thereof is large, a bit line voltage of the normal cell is highly reduced compared to the defective cell. As a result, a differential voltage of the bit line voltage from a voltage of bit line reference (VBLR) is quite small for the defective cell, while the differential voltage is large enough for the normal cell.

As described above, it is revealed that the differential voltage of the bit line is different for the normal cell and the defective cell. If the differential voltage is large, operation of the sense amplifier becomes stable. However, if the differential voltage is small, the operation of the sense amplifier becomes unstable. In some cases, the sense amplifier may fail to operate, and read data which has inverted logic.

However, since the bit line voltage of the defective cell is passably lower than the VBLR as shown in FIG. 12, the sense amplifier may operate as desired. This means that the defective cell cannot be detected in the actual test process.

Since the defective cell may induce an incorrect operation of the sense amplifier, the defective cell should be reliably detected during the test process. For this reason, the test under an accelerated condition that easily induces a failure is generally examined. There are many types of the test mode that provides the accelerated condition during the DRAM test. In order to reliably induce an incorrect operation of the sense amplifier when the differential voltage is small, there is a method that changes the VBLR level.

When the VBLR level is changed, the differential voltage which is received by the sense amplifier during the read out operation is changed. For such a case, the differential voltage is described hereinafter. Based on charge conservation law, the following equation (1) is derived as;

$$Cs \times Vs + Cb \times VBLR = (Cs+Cb) \times Vb \qquad (1).$$

Therefore, the differential voltage $\Delta V$ is obtained as;

$$\Delta V = |VBLR - Vb| \qquad (2)$$
$$= |VBLR - (Cs \times Vs + Cb \times VBLR)/(Cs+Cb)|,$$

where Cs is the cell capacitance, Cb is the bit line capacitance, Vs is the cell voltage, VBLR is the bit line stand-by voltage, and Vb is the bit line voltage after activating the word line.

In the case of reading out L-data, the cell voltage Vs can be set to 0 V, hence, the differential voltage $\Delta VL$ is obtained as;

$$\Delta VL = VBLR \times Cs/(Cs+Cb) \qquad (3).$$

In the case of reading out H-data, the cell voltage Vs is set to Va, hence, the differential voltage $\Delta VH$ is obtained as;

$$\Delta VH = (Va-VBLR) \times Cs/(Cs+Cb) \qquad (4).$$

From Eq. (3), for the case of reading out L-data, the differential voltage $\Delta VL$ becomes low through the VBLR being set low, so that the accelerated condition can be realized. On the other hand, for the case of reading out H-data, from Eq. (4), the differential voltage $\Delta VH$ becomes low through the VBLR being set high, so that the accelerated condition can be realized.

A semiconductor memory device that enables simultaneous read-out through a bit line shared by a plurality of cells is disclosed in Japanese Patent No. 2732762. A semiconductor memory device that includes a circuit generating a reference voltage is disclosed in Japanese Unexamined Patent Application, First Publication, No. 2005-339590. A semiconductor memory device that simultaneously activates a plurality of word lines is disclosed in Japanese Unexamined Patent Application, First Publication, No. 2006-260735. However, the prior art fails to disclose a semiconductor memory device that examines the defective cell test under the accelerated condition by changing the voltage of bit line reference.

According to the conventional failure detection test in the semiconductor memory device, there has explained the method, in the case of reading out the cell by the acceleration, that provides the accelerated condition in which the differential voltage is smaller during the sense amplifier operation than that of an usual operation by changing the VBLR, so as to examine the failure detection test.

Even if the accelerated condition is applied, although the differential voltage decreases, the differential voltage does not invert to the reference voltage. The invert means that the bit line voltage is higher or lower than the reference voltage when the L-data or the H-data is read out. Accordingly, since the sense amplifier correctly operates, the defective cell may not be detected. Particularly, since the cell capacitance Cs of the defective cell is small, it is revealed from Eqs. (3) and (4), in this case, that the effect of the accelerated condition by changing the VBLR on the differential voltage is small.

SUMMARY

The present invention seeks to solve one or more of the above problems, or to improve those problems at least in part.

In one embodiment, there is provided a semiconductor memory device that reads and writes data from and to a plurality of memory cells in a memory cell array by selecting a word line and a bit line includes a sense amplifier circuit that amplifies a differential voltage between a cell data level read from the bit line and a bit line reference level so as to output the data during reading the data, a first circuit that changes the bit line reference level from a predetermined level into a changed level, a second circuit that writes the changed level to a first memory cell among the memory cells, a bit line for selecting the first memory cell being commonly connected to a second memory cell, and a third circuit that simultaneously activates first and second word lines connected to the first and second memory cells, respectively.

According to the semiconductor memory device made of the above configuration, the bit line reference level that precharges the bit line can be changed. The plural memory cells connecting with the common bit line, for example, the object cell and the counter cell, can be simultaneously selected. After the predetermined level (for example, the minimum voltage of 0 V) is written in the object cell and the bit line reference level changed is written in the counter cell, the word lines of the object cell and the counter cell are simultaneously activated, the data of the object cell and the counter cell are simultaneously read out, and hence, it is determined whether the object cell is normal or defective, based on the voltage level of the common bit line. Thereby, the defective cell in the semiconductor memory device can be reliably detected.

In another embodiment, there is provided a method of defective cell test according to a semiconductor memory device that read and writes data from and to a plurality of memory cells in a memory cell array by selecting a word line and a bit line, and includes a sense amplifier circuit which amplifies a differential voltage between a cell data level read from the bit line and a bit line reference level so as to output data during reading data. The method of defective cell test includes changing the bit line reference level from a predetermined level into a changed level, writing the changed level to a first memory cell among the memory cells, a bit line for selecting the first memory cell being commonly connected to a second memory cell, and activating simultaneously first and second word lines connected to the first and second memory cells, respectively.

According to the defective cell test method made of the above procedures, the bit line reference level that precharges the bit line can be changed. The plural memory cells connecting with the common bit line, for example the object cell and the counter cell, can be simultaneously selected. After the predetermined level (for example, the minimum voltage of 0 V) is written in the object cell and the bit line reference level changed is written in the counter cell, the word lines of the object cell and the counter cell are simultaneously activated, the data of the object cell and the counter cell are simultaneously read out, and hence, it is determined whether the object cell is normal or defective, based on the voltage level of the common bit line. Thereby, the defective cell in the semiconductor memory device can be reliably detected.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be described herein with reference to illustrative embodiments. Those skilled in the art will recognize that many alternative embodiments can be accomplished using the teachings of the present invention and that the invention is not limited to the embodiments illustrated here for explanatory purposes.

In addition, the drawings to be referred to in the following descriptions are views to explain the semiconductor device of the present embodiment, and therefore the magnitude such as the size or the thickness of each portion illustrated may be different from that of each portion of a real semiconductor device.

[Explanation of a Configuration of the Semiconductor Memory Device According to the Embodiment]

Figure 1:
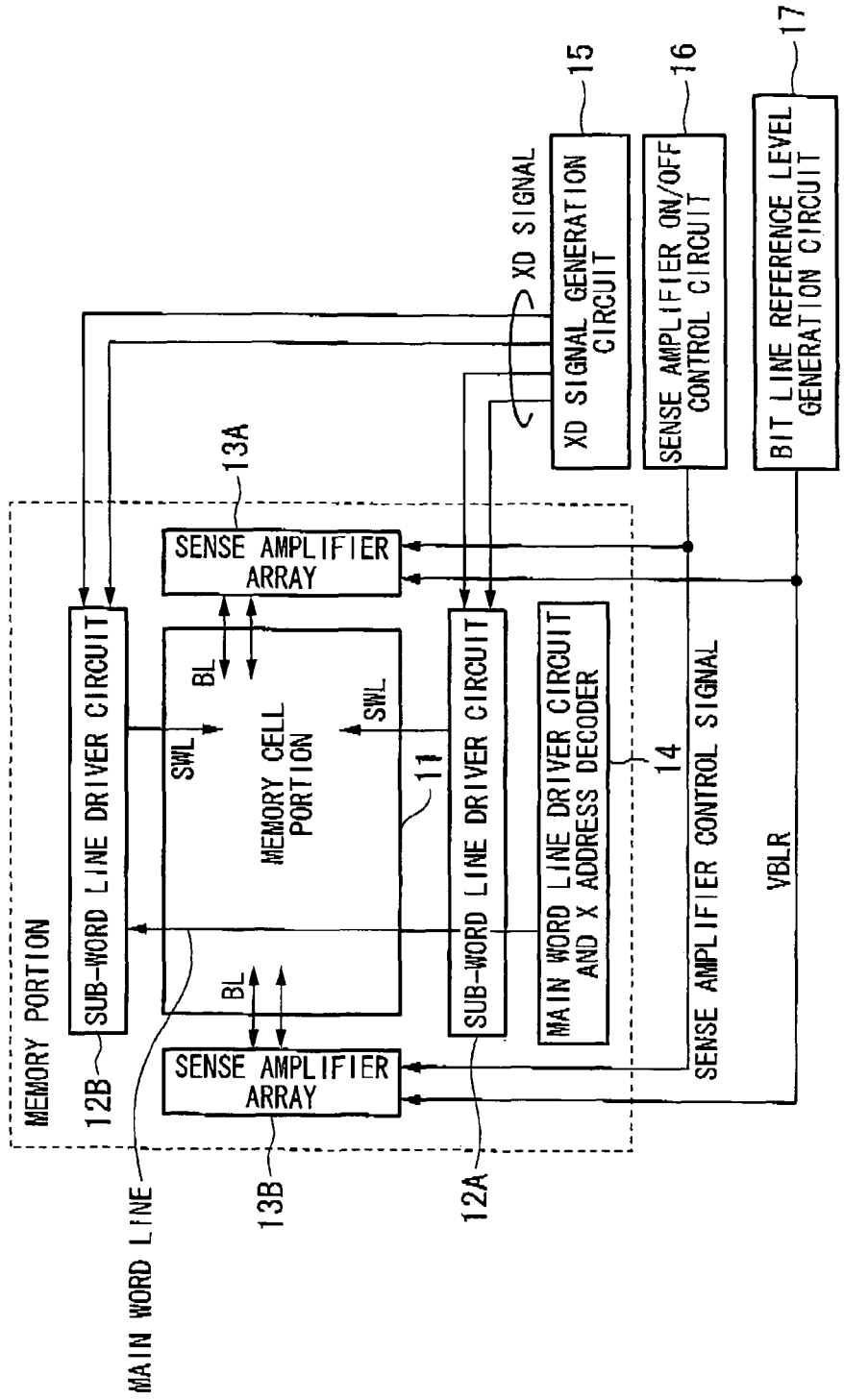
FIG. 1 is a block diagram that shows a configuration of a semiconductor memory device according to an embodiment of the present invention.

FIG. 1 shows a configuration of a semiconductor memory device according to an embodiment of the present invention, and is a block diagram showing the entire configuration with regard to necessary circuits to examine a test of the semiconductor memory device.

In the semiconductor memory device shown in FIG. 1, there are provided a memory cell portion (memory cell array) 11 at the center, sub-word line driver circuits 12A and 12B placed above and below the memory cell portion 11, and sense amplifier arrays 13A and 13B placed at the both sides thereof. A main word line driver circuit and X address decoder 14 is provided below the sub-word line driver circuit 12A. The main word line driver circuit and X address decoder may be simply called a main word line driver circuit.

The memory cell portion 11 communicates with the sense amplifier arrays 13A and 13B through a bit line BL. The sub-word line driver circuits 12A and 12B output a sub-word line SWL to the memory cell portion 11. The main word line driver circuit 14 outputs a main word signal to the sub-word line driver circuits 12A and 12B. An XD signal generation circuit 15 outputs an XD signal to the sub-word line driver circuits 12A and 12B.

A sense amplifier ON/OFF control circuit (SA ON/OFF control circuit) 16 outputs a sense amplifier control signal to the sense amplifier arrays 13A and 13B. A bit line reference level generation circuit 17 outputs a bit line reference level (VBLR) to the sense amplifier arrays 13A and 13B.

Figure 2:
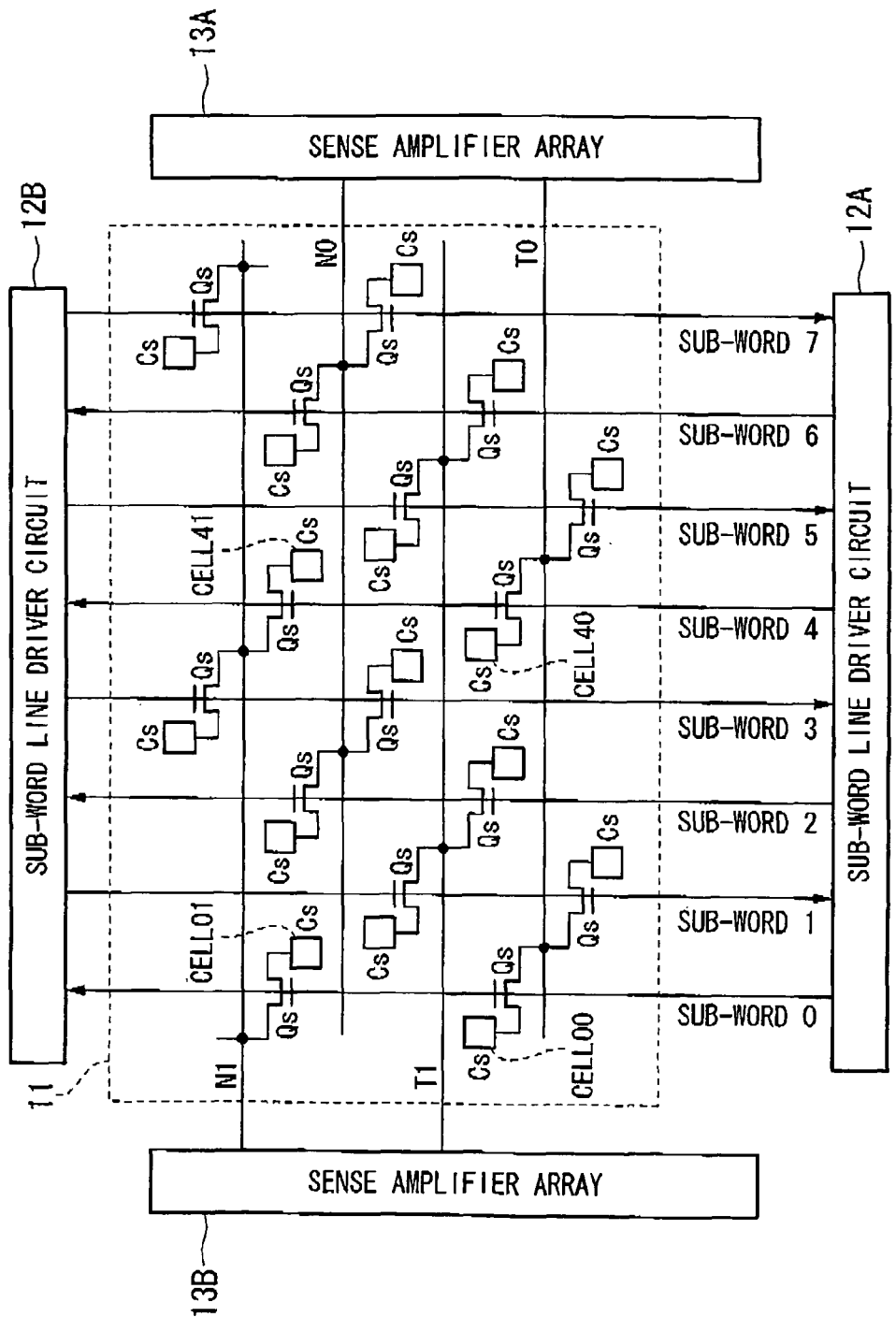
FIG. 2 is a circuit diagram that shows a configuration of a memory cell portion.

FIG. 2 shows a configuration of the memory cell portion (memory cell array) 11. Hereinbelow, the memory cell portion 11 will be set forth with reference to FIG. 2. Here, a memory cell arrangement having a quater pitch is indicated that is a recent mainstream. As shown in FIG. 2, the memory cell portion 11 includes a select transistor (N-channel transistor) Qs and a cell (capacitor) Cs that connects with a source of the Qs at an intersection of the sub-word line and the bit line, and composes the memory cell array.

The sub-word lines 0, 2, 4, 6, . . . are input from the sub-word line driver circuit 12A which is placed below the memory cell portion 11, while the sub-word lines 1, 3, 5, 7, . . . are input from the sub-word line driver circuit 12B which is placed above the memory cell portion 11.

The bit lines T0, N0, T2, N2, . . . (T0 and N0 only indicated) connect with the sense amplifier array 13A which is placed at the right hand side of the memory cell portion 11, while the bit lines T1, N1, T3, N3, . . . (T1 and N1 only indicated) connect with the sense amplifier array 13B which is placed at the left hand side of the memory cell portion 11.

The sub-word lines that connect with the bit line T0 are addressed as 0, 1, 4, 5, . . . , while the sub-word lines that connect with the bit line N0 are addressed as 2, 3, 6, 7, . . . , The sub-word lines that connect with the bit line T1 are addressed as 1, 2, 5, 6, . . . , while the sub-word lines that connect with the bit line N1 are addressed as 0, 3, 4, 7, . . . .

In the embodiment, two sub-word lines that connect with the same bit line are required to be simultaneously activated. In this manner, there is considered with reference to FIG. 2 which sub-word lines should be simultaneously activated. For example, when the sub-word 0 is activated, the cell 00 and the cell 01 that connect therewith output cell data to the bit lines T0 and N1, respectively. The sub-word line that has the cell connecting with the bit lines T0 and N1, corresponds to the sub-word 4. This is because that the memory cell array is repeated in a unit including the 4 sub-word lines.

Figure 3:
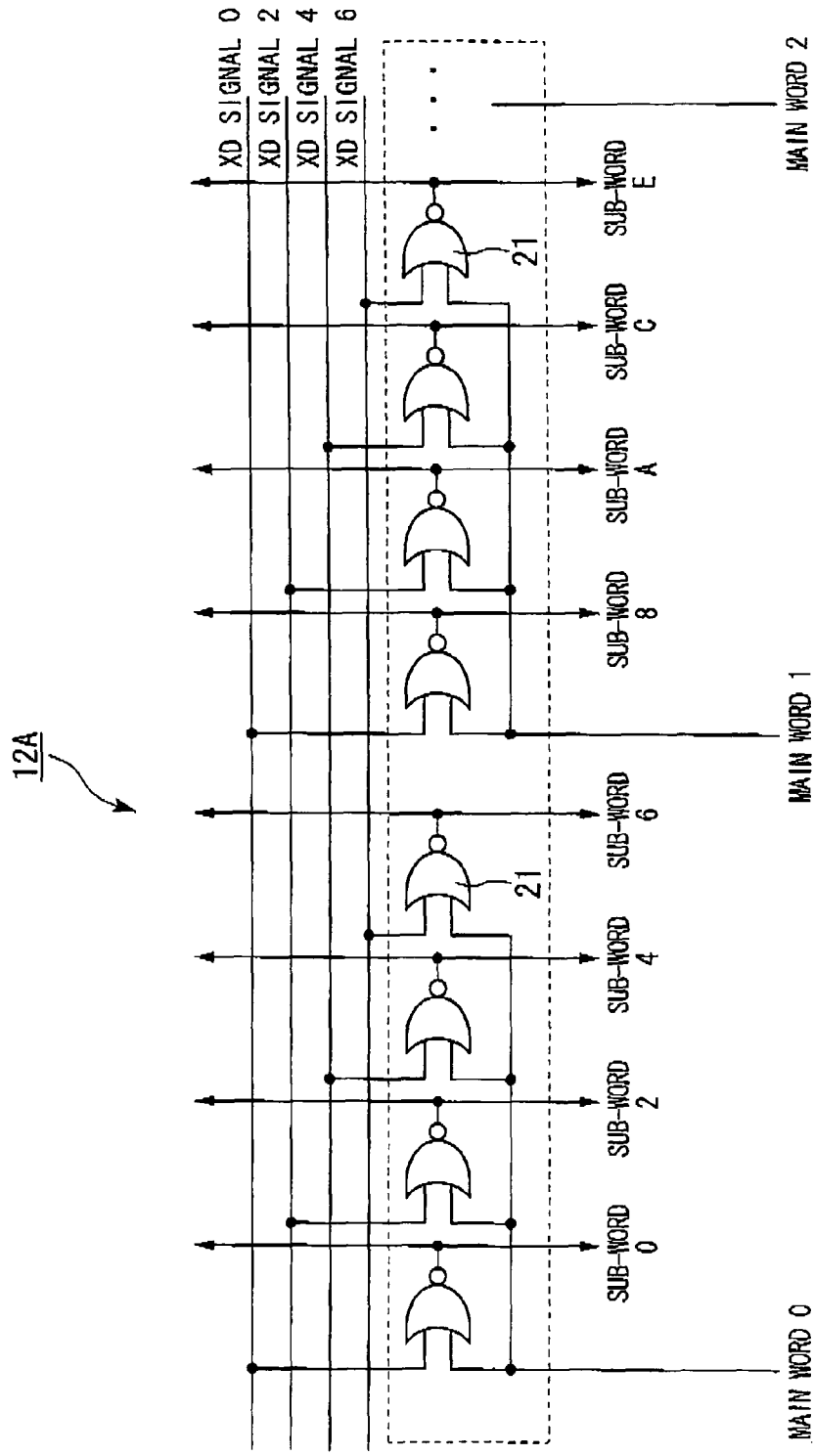
FIG. 3 is a circuit diagram that shows a configuration example of a sub-word line driver circuit.

FIG. 3 shows a configuration example of the sub-word line driver circuit. Hereinbelow, the configuration of the sub-word line driver circuit will be described with reference to FIG. 3. The sub-word line driver circuit shown in FIG. 3 corresponds to the configuration example of the sub-word line driver circuit 12A that is placed below the main word line driver circuit 14 in FIG. 2. The sub-word line driver circuit 12B has the same configuration.

Here, the case, in which the 4 pairs of the XD signals are input to the sub-word line driver circuit 12A, is described. One main word line is input to 4 NOR elements 21. Each of the 4 pairs of the XD signals are input to the respective 4 NOR elements 21.

The NOR element to which the main word 0 and the XD signal 0 are input outputs the sub-word 0, the NOR element to which the main word 0 and the XD signal 2 are input outputs the sub-word 2, and the NOR element to which the main word 1 and the XD signal 0 are input outputs the sub-word 8.

In the above explanation of FIG. 2, there is described a necessary mechanism that can simultaneously activate the pair of the sub-words 0 and 4 or the pair of the sub-words 1 and 5. In this manner, in the sub-word line driver circuit, although only one main word line has to be selected as usual, the mechanism, which selects the multiple XD signals, is required. That is, for example, the mechanism simultaneously selects the XD signals 0 and 4.

Figure 4:
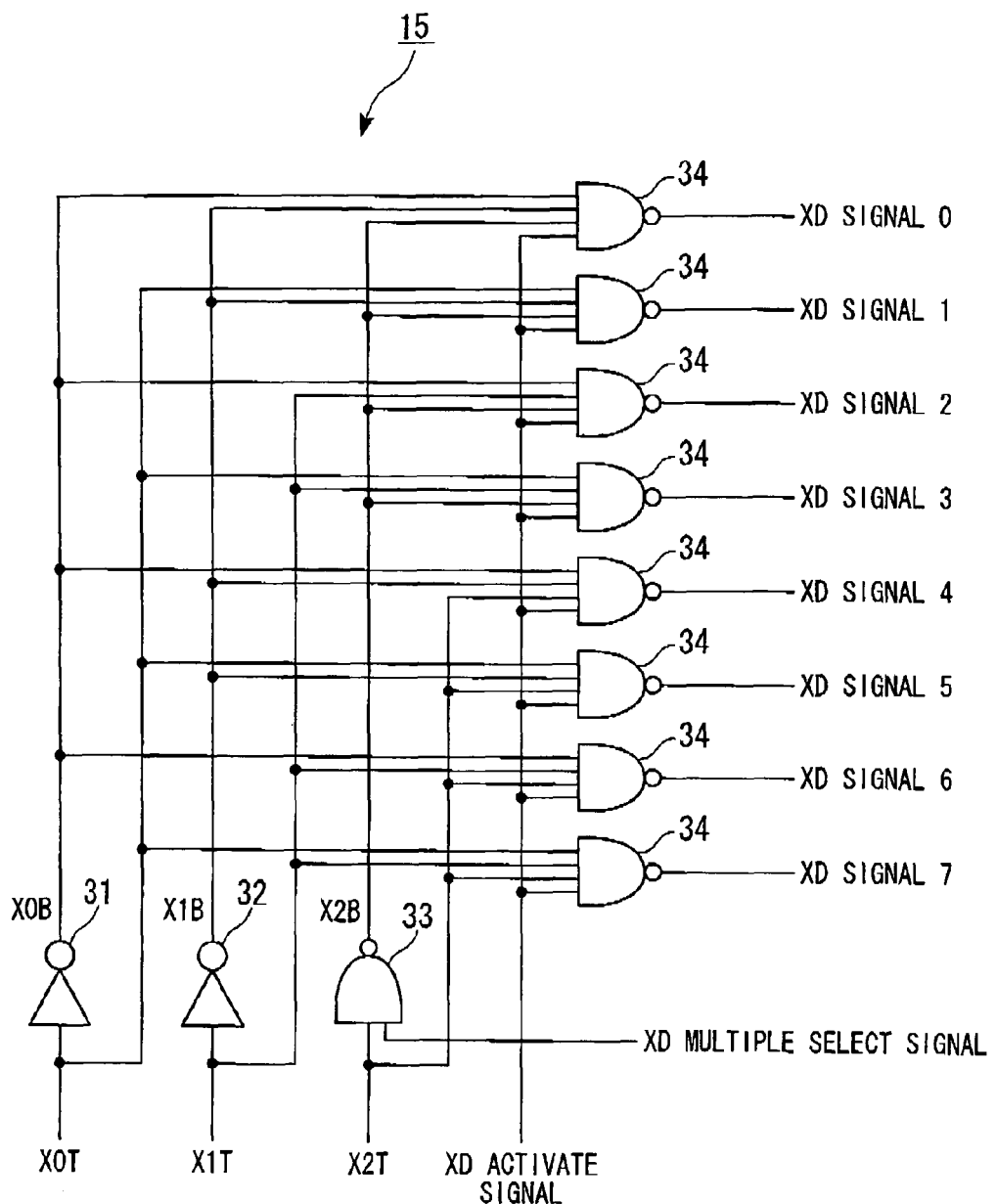
FIG. 4 is a circuit diagram that shows a configuration example of a XD signal generation circuit.

FIG. 4 shows a configuration example of the XD signal generation circuit. Hereinbelow, the configuration of the XD signal generation circuit 15 will be set forth with reference to FIG. 4.

Here, the XD signal generation circuit 15 plays a role in decoding 3 X-addresses 0, 1 and 2. That is, a total of 8 pattern signals are converted such as (X0, X1, X2)=(L, L, L) through (X0, X1, X2)=(H, H, H).

TRUE signals of the X-addresses 0 and 1, X0T and X1T, are input to NOT elements 31 and 32, respectively, so as to generate BAR (FALSE) signals (inverted logic signals) of the X-addresses 0 and 1, X0B and X1B. The TRUE signal of the X-address 2, X2T, is input to a NAND element 33 so as to generate the BAR (FALSE) signal (inverted logic signal) of the X-address 2, X2B.

Then, TRUE/BAR (TRUE/FALSE) signals of the X-addresses 0, 1 and 2 are input to NAND elements 34. A XD activate signal that activates the XD signals is input to the NAND elements 34.

As is described above, when the test of the embodiment is examined, the sub-word lines addressed as difference of 4, (e.g., the sub-words 0 and 4) are required to be simultaneously activated. For this reason, a XD multiple select signal as the test signal is input to one input of the NAND element 33, the other input of the NAND element 33 is addressed as the X2T, and the NAND element 33 outputs the X2B.

Figure 5:
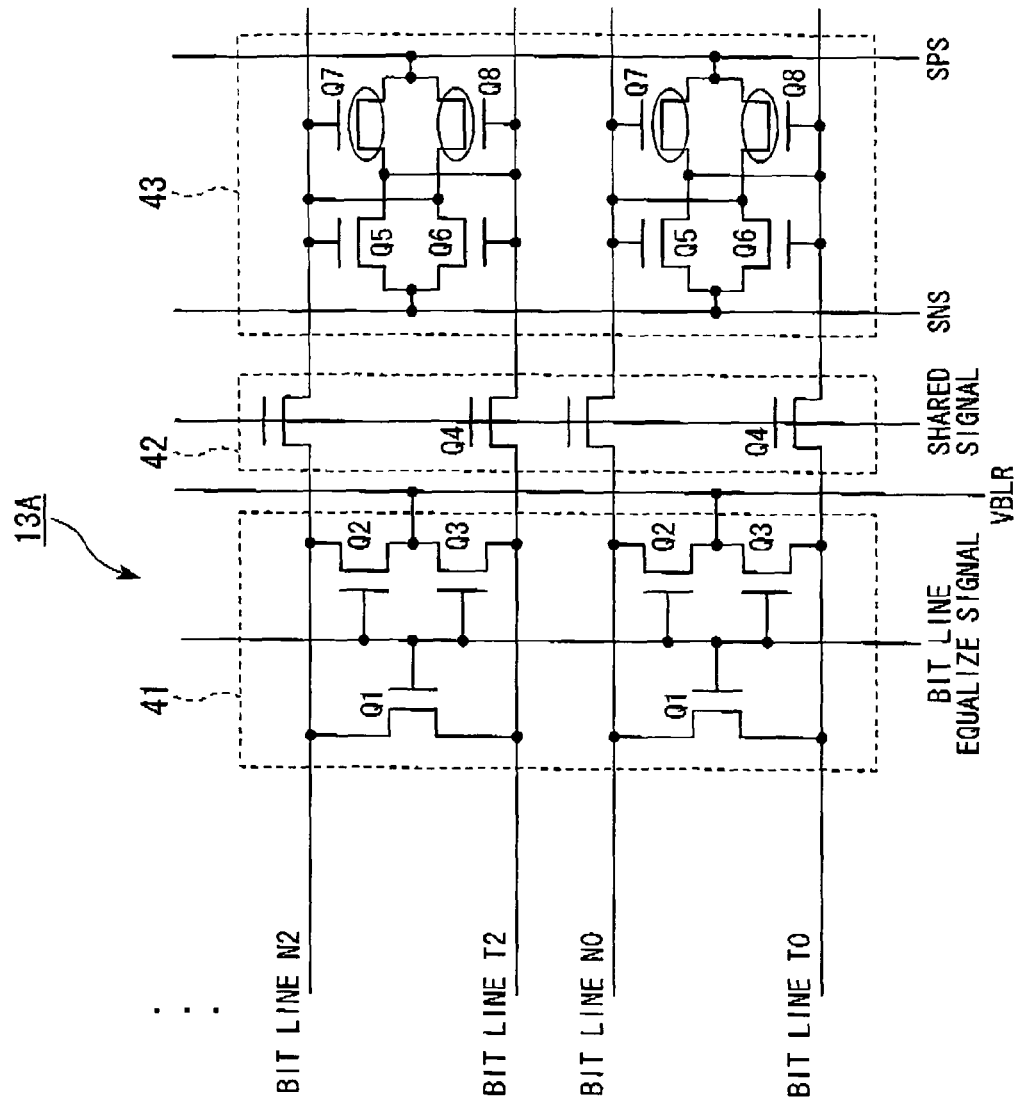
FIG. 5 is a circuit diagram that shows a configuration example of a sense amplifier circuit.

FIG. 5 shows a configuration example of the sense amplifier circuit that is a general example. The sense amplifier circuit shown in FIG. 5 corresponds to the circuit configuration of the sense amplifier array 13A that is placed at the right hand side of the memory cell portion 11 in FIG. 2. The sense amplifier array 13B that is placed at the left hand side of the memory cell portion 11 in FIG. 2 has the same configuration.

In FIG. 5, while the bit lines T0 and N0 are made of a pair of the bit lines, the bit lines T2 and N2 are made of another pair of the bit lines. The bit Lines T0 and N0 connect with an equalize portion (precharge circuit portion of the bit line) 41. The equalize portion 41 includes 3 N-channel (Nch) transistors Q1, Q2 and Q3 whose gates connect with a bit line equalize signal line in the respective pair of the bit lines. The source and drain of the transistor Q1 connect with the pair of the bit lines. Each drain of the transistors Q2 and Q3 connects with the signal line of the VBLR, while each source of the transistors Q2 and Q3 connects with the pair of the bit lines.

The bit line equalize signal controls the equalize portion 41. During equalizing, the VBLR (bit line reference level) is input as the bit line equalize signal.

The bit line connects with a sense amplifier portion 43 through an Nch transistor Q4 in a shared portion 42. A shared signal is input to the gate of the transistor Q4 in the shared portion 42. The sense amplifier portion 43 includes Nch transistors Q5 and Q6, and P-channel (Pch) transistors Q7 and Q8. A sense amplifier Nch side source (SNS) signal is input to the source of the Nch transistors Q5 and Q6, while a sense amplifier Pch side source (SPS) signal is input to the source of the Pch transistors Q7 and Q8.

Figure 6:
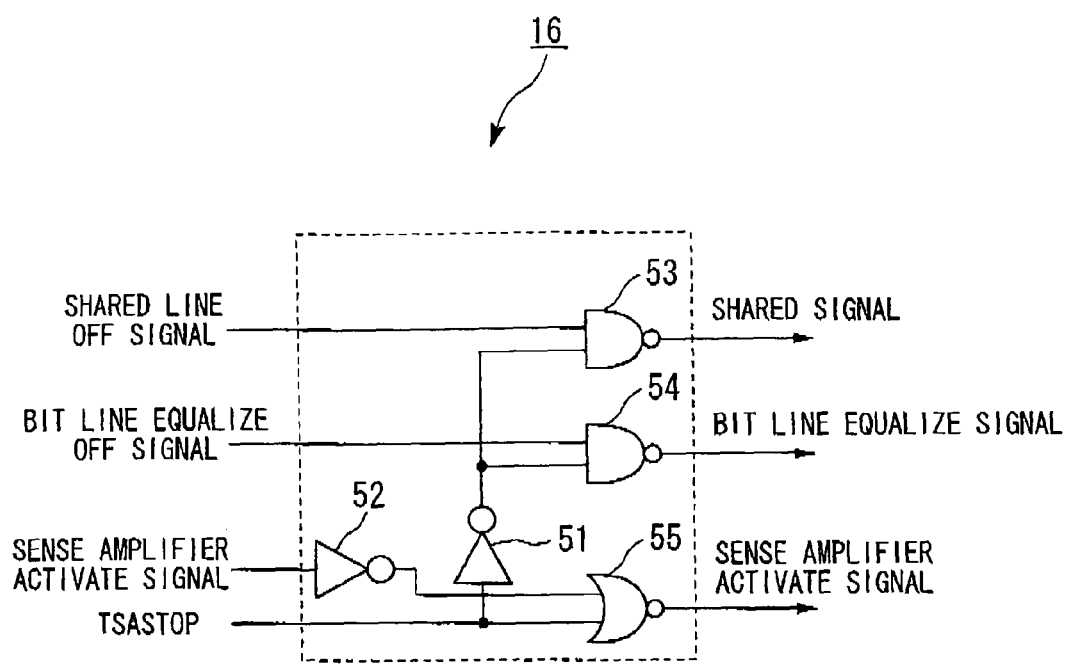
FIG. 6 is a circuit diagram that shows a configuration example of a sense amplifier ON/OFF control circuit.

FIG. 6 shows a configuration example of the sense amplifier ON/OFF control circuit (SA ON/OFF control circuit). Hereinbelow, the sense amplifier ON/OFF control circuit 16 will be set forth with reference to FIG. 6.

A shared line off signal that turns off the shared portion 42 in the sense amplifier circuit is input to the sense amplifier ON/OFF control circuit 16. Furthermore, a bit line equalize off signal and a sense amplifier activate signal 0 are input to the sense amplifier ON/OFF control circuit 16, where the bit line equalize off signal aborts the bit line equalizing, and the sense amplifier activate signal 0 activates the sense amplifier. In addition, a signal TSASTOP which is used in the test of the present invention is input to the sense amplifier ON/OFF control circuit 16.

When the signal TSASTOP="L", an output of a NOT element 51 becomes an "H". Therefore, the shared signal which is the inverted phase of the shared line off signal is output through a NAND element 53. Similarly, the bit line equalize signal which is the inverted phase of the bit line equalize off signal is output through the NOT element 51 and a NAND elements 54. A sense amplifier activate signal which is the same phase of the sense amplifier activate signal 0 is output through a NOT element 52 and a NOR element 55.

When the signal TSASTOP="H", the output of the NOT element 51 becomes an "L". Therefore, the shared signal and the bit line equalize signal always become an "H" through the NOT elements 53 and 54, while the sense amplifier activate signal always becomes an "L" through the NOR elements 55. The sense amplifier activate signal plays a role that pulls up the signal line SNS or SPS (refer to FIG. 5) from the bit line reference level to a ground (GND) or a VARRAY level, respectively. Since the configuration of the part related to the signal lines SNS and SPS is not associated with the present invention, the explanation thereof is omitted. The VARRAY corresponds to the highest voltage (circuit power supply voltage, or the like) in the sense amplifier circuit shown in FIG. 5.

Figure 7:
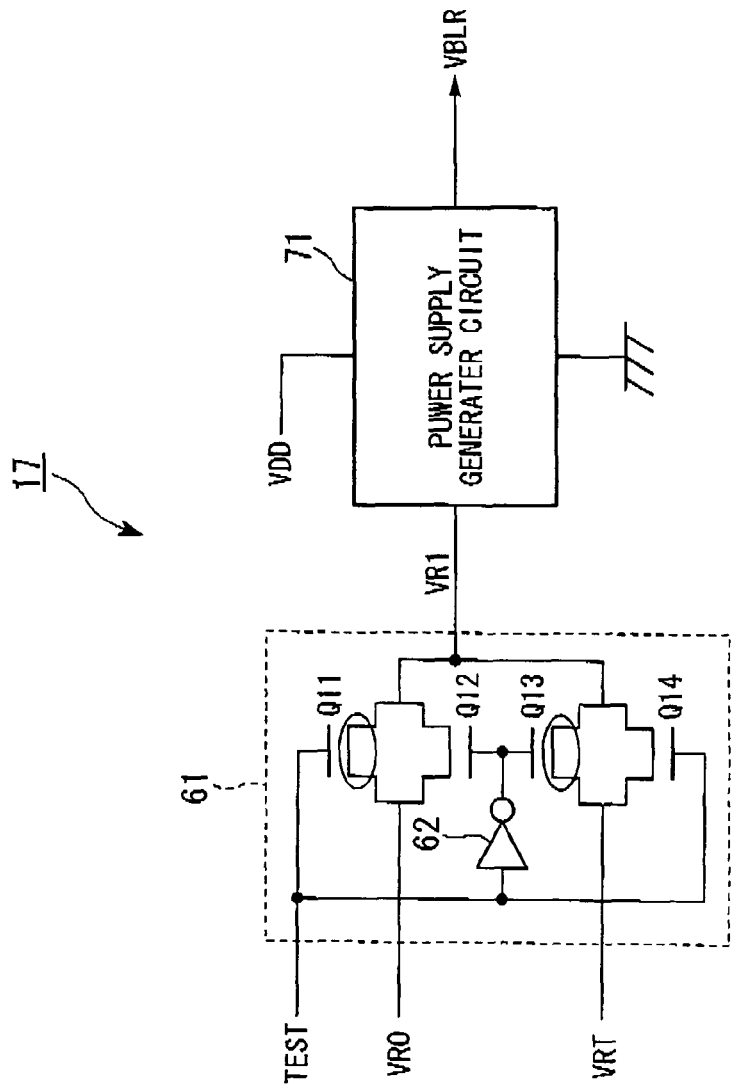
FIG. 7 is a circuit diagram that shows a configuration example of a bit line reference level generation circuit.

FIG. 7 shows a configuration example of the bit line reference level generation circuit. Hereinbelow, the bit line reference level generation circuit 17 will be described with reference to FIG. 7.

The bit line reference level (VBLR) is generated from a power supply generator circuit 71 to which an external power supply VDD is input as its source, taking a reference signal VR1 which is output from a reference level select circuit 61. The reference signal VR1 can be switched into a signal VR0 or a signal VRT through the reference level select circuit 61. The signal VR0 is employed during the normal operation and the signal level thereof is set to VARRAY/2.

On the other hand, the signal VRT is employed during the test of the present invention. The signal VRT is directly led from an external pin input so as to enable providing the arbitrary level. The changed bit line reference level which is generated through the signal VRT corresponds to the reference level for the test as mentioned above.

A test signal TEST="L" during the normal operation. In this case, an output of a NOT element 62 becomes an "H", a Pch transistor Q11 and an Nch transistor Q12 turn on, and hence, VR0=VR1.

When TEST="H", the output of the NOT element 62 becomes an "L", a Pch transistor Q13 and an Nch transistor Q14 turn on, and hence, VRT=VR1.

[Explanation of an Operation of the Semiconductor Memory Device According to the Embodiment]

Subsequently, a circuit operation of the semiconductor memory device of the present invention will be described with reference to a test flow chart shown in FIG. 8 and timing charts shown in FIGS. 9, 10 and 11.

Figure 8:
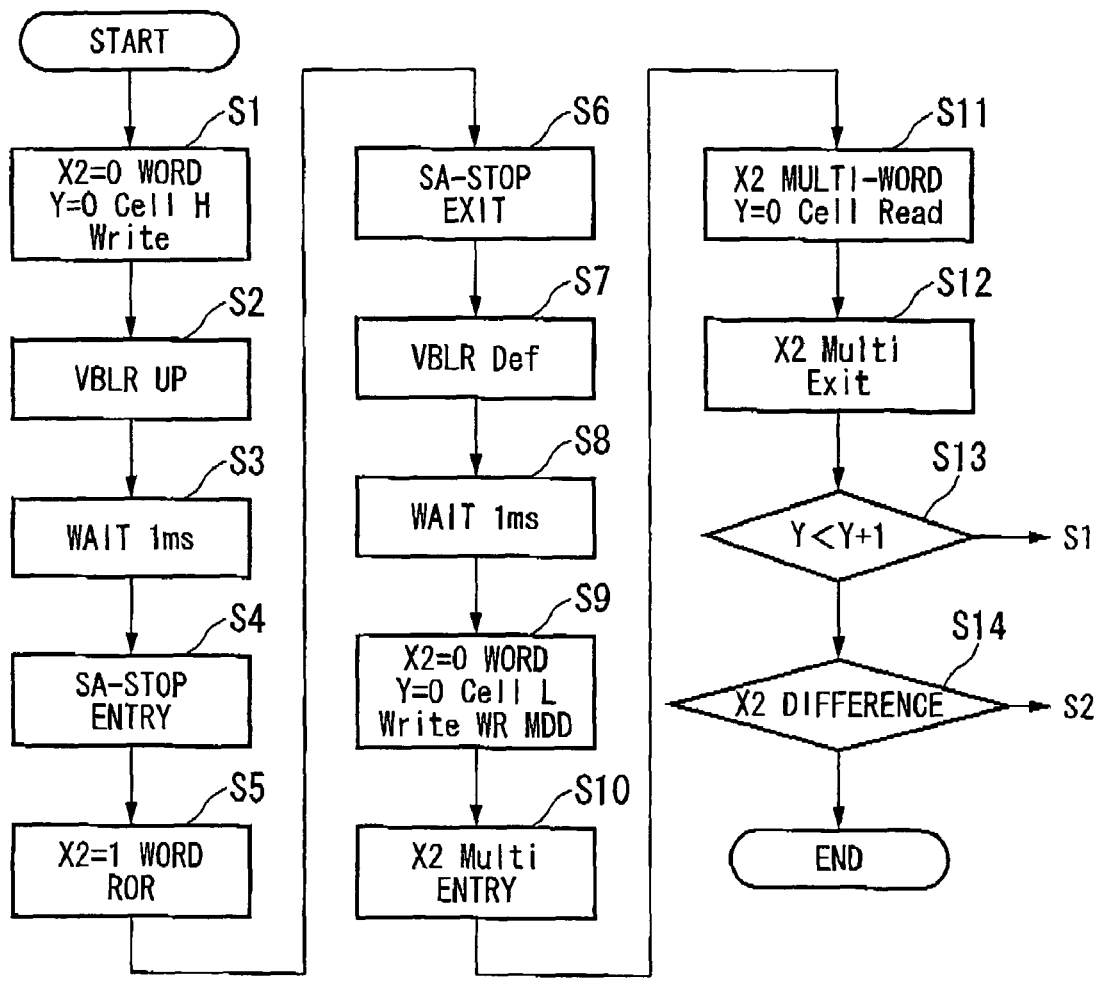
FIG. 8 is a flow chart that shows a procedure of a cell test according to the present invention.
Figure 9:
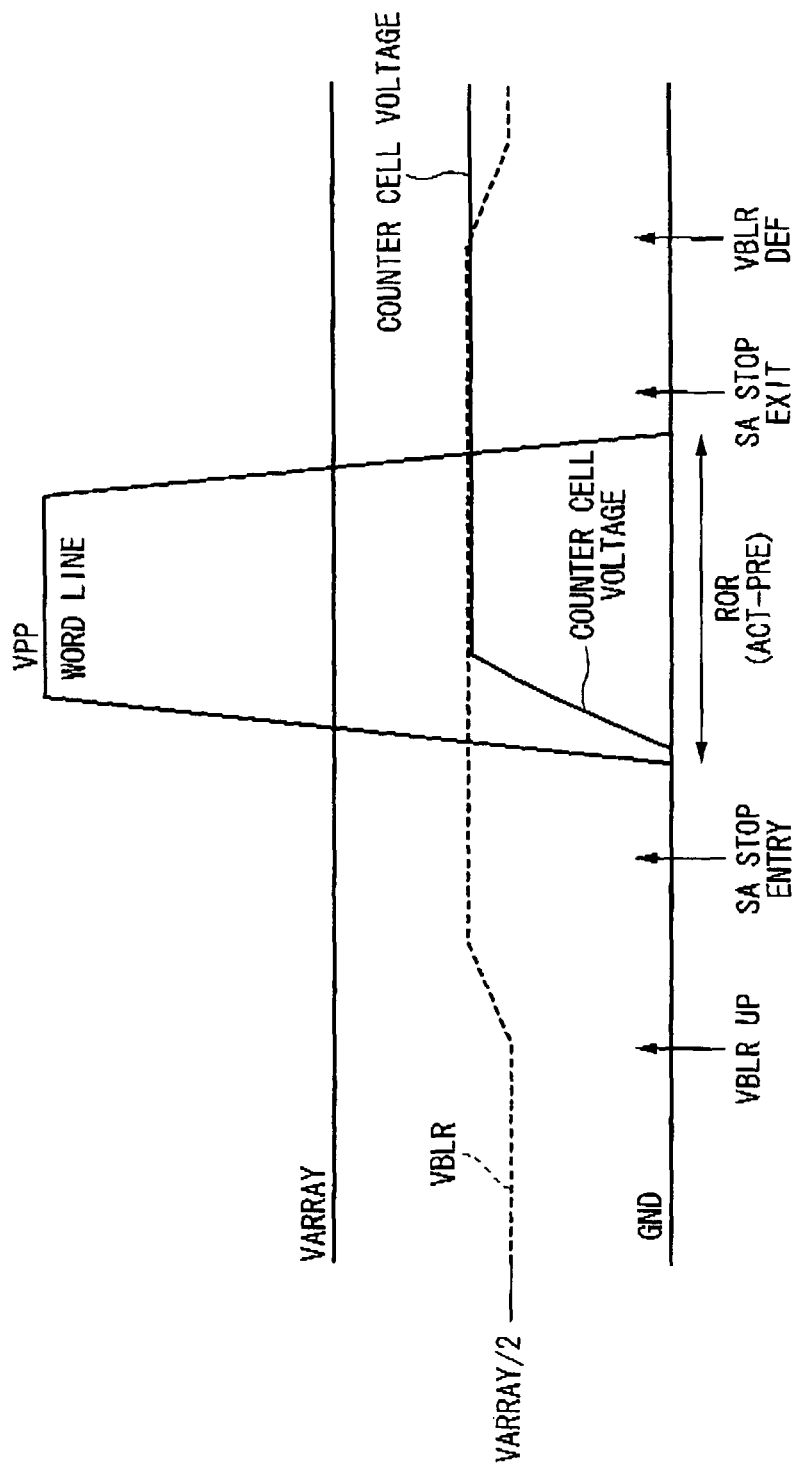
FIG. 9 is a timing chart that shows signal waveforms while writing data to a counter cell.

FIG. 8 shows a procedure of the cell test according to the embodiment. As is mentioned above in the configuration example of the semiconductor memory device, the counter cell is selected to have the word line addressed as difference of 4 from that of the object cell, in the cell test of the embodiment. For example, as the counterpart of the sub-word line 0, the sub-word line 4 is selected.

In this manner, in the first step S1, data, as a background, is written in the cells that connect with the X2=0 word, or the words addressed as X=0, 1, 2, 3, 8, 9, A, B, . . . , and correspond to the half of the memory cells. This operation may be quite similar to the usual data writing operation.

Then, the data is written in the counter cell after steps from S2 to S8 shown in FIG. 8. In the step S2, "VBLR UP" means that the test sequence enters a test mode in which the VBLR can be controlled to the arbitral level. As set forth, the test signal TEST is set to an "H" so that the VBLR is shifted to the VRT level in the bit line reference level generation circuit 17 shown in FIG. 7. Thereby, from a timing shown in FIG. 9 (VBLR UP), the VBLR level is shifted from a normal level (VARRAY/2) to the higher level (reference level for the test).

Subsequently, after waiting for the shift of the VBLR in the step S3, the test sequence enters a sense amplifier stop mode SASTOP from the step S4 (refer to a time SA STOP ENTRY shown in FIG. 9). This means, in light of the circuit operation, that the signal TSASTOP is shifted from an "L" to an "H" in the sense amplifier ON/OFF control circuit 16 shown in FIG. 6. Therefore, the sense amplifier activate signal is fixed to an "L", while the shared signal and the bit line equalize signal are fixed to an "H".

Then, in the step S5, a ROR operation, that is, operation of word line ACT to word line PRE, is performed for the X2=1 word corresponding to the counter cell, or the words addressed as X=4, 5, 6, 7, C, D, E, F, . . . . As shown in FIG. 9, the word line is shifted to the VPP level by a command ACT. At this time, the voltage of the cell (counter cell) that connects with the word line is shifted to the VBLR level, as shown in FIG. 9.

If the command ACT is in the normal operation, the equalize portion 41 shown in FIG. 5 turns off. However, since the test sequence has already entered the SASTOP mode, the equalize portion 41 turns on so that the bit line is driven to the VBLR level. Therefore, the cell (counter cell) that connects with the word line is shifted to the VBLR level.

Alternately, if in the normal operation, a predetermined time is elapsed after the word line is pulled up, and then, the sense amplifier starts to operate. However, in this case, since the test sequence has entered the SASTOP mode, the sense amplifier is not activated. That is, the signals SNS and SPS shown in FIG. 5 do not operate. After the VBLR level is fully written to the counter cell, a command PRE is entered, and then, the word line is pulled down so as to complete the writing of the VBLR to the counter cell.

Subsequently, the sense amplifier is released from the sense amplifier stop condition by a command SASSTOP EXIT in the step S6. Then, in the step S7, the test signal TEST shown in FIG. 7 returns to an "L" by a command VBLR DEF, so that the VBLR level returns to the VR0, that is, the VBLR level in the normal operation (VARRAY/2). In the step S8, the VBLR is waited until completing the shift thereof.

In a step S9, the inverted data to the data written in the step S1 is written in the object cell (X2=0 word) within the minimum specification time. Thereby, the quantity of electric charge of the object cell becomes the minimum under normal operation.

Then, the read out by multi-word operation, which is the most important issue, is performed after steps from S10 to S12.

In the step S10, "X2 Multi ENTRY" means that the test sequence enters a test mode in which the words addressed as difference of X2 (sub-words addressed as difference of 4) are simultaneously activated. As set forth, the XD multiple select signal is changed from an "H" to an "L" under normal condition so as to maintain X2B at an "H" in FIG. 4. Alternately, the input of the X2 address is set to an "H" so as to maintain X2T at an "H". Thereby, the pairs of XD signals 0 and 4, 1 and 5, 2 and 6, and 3 and 7 are simultaneously activated, respectively.

Figure 10:
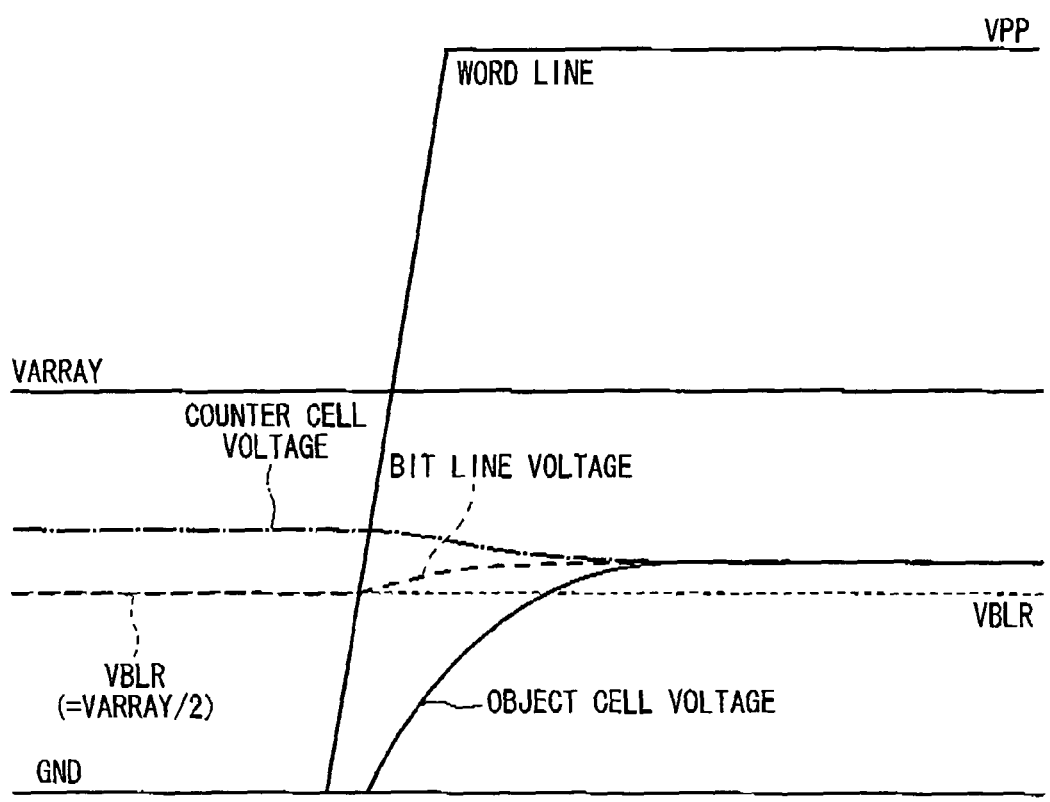
FIG. 10 is a timing chart that shows the signal waveforms while reading out a defective cell.
Figure 11:
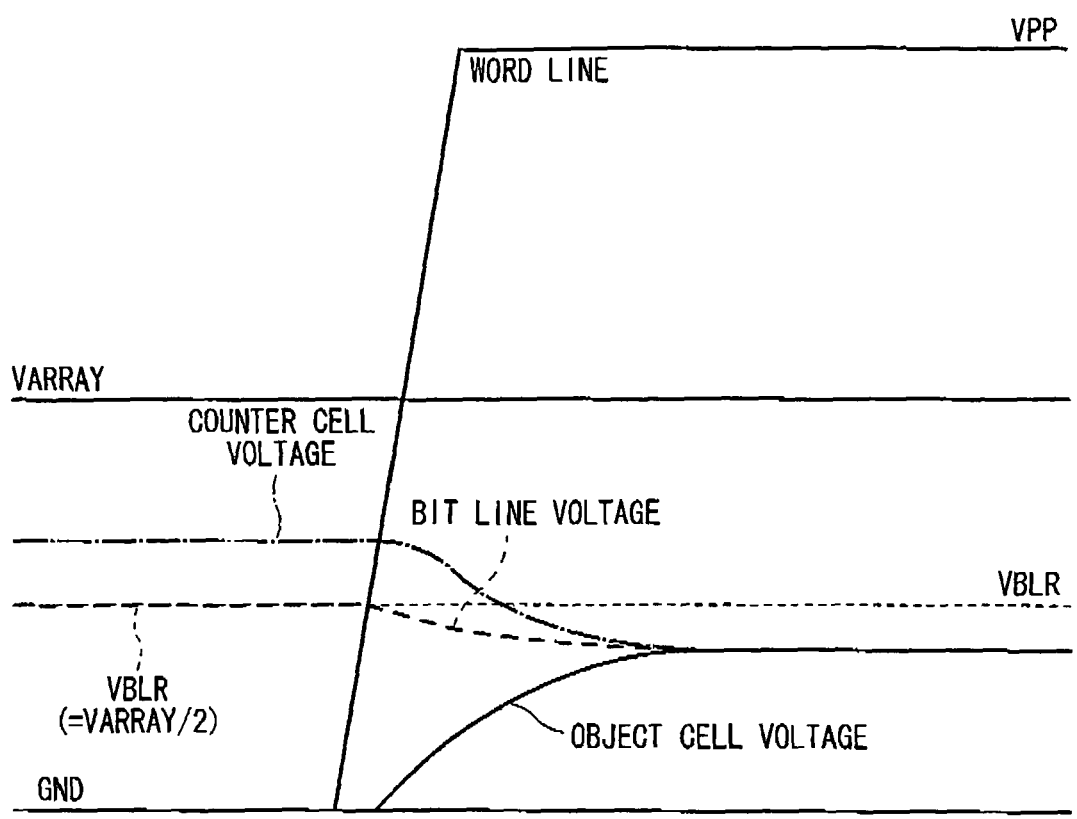
FIG. 11 is a timing chart that shows the signal waveforms while reading out an object cell being normal.
Figure 12:
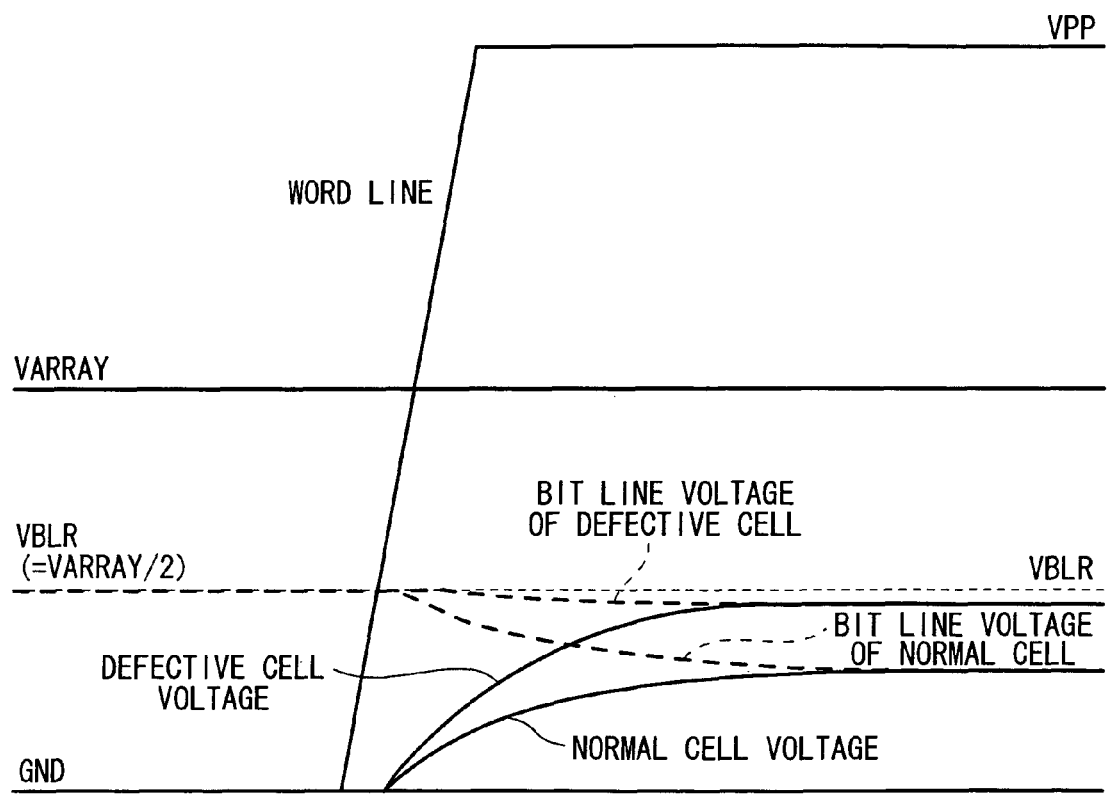
FIG. 12 is a timing chart that shows the signal waveforms while reading out a cell according to a conventional semiconductor memory device.

FIGS. 10 and 11 show signal waveforms under the test method of the present invention. FIG. 10 shows the read out waveforms in the case of the defective cell, in which the cell capacitance of the object cell is almost zero. Before reading out, the voltage of the object cell is set to 0 V, while the voltage of the counter cell is set to the VBLR+α. When the command ACT is input, the sub-word lines of the object cell (test examined cell) and the counter cell addressed as difference of 4 are simultaneously pulled up, due to the configuration of the XD signal generation circuit 15 shown in FIG. 4.

When the sub-word lines are pulled up, although the bit line voltage changes, the cell capacitance of the defective cell is almost zero. For this reason, since the data amount obtained from the defective cell is quite low, the data from the counter cell becomes dominant, and hence, the bit line voltage becomes higher than the bit line reference level VBLR. That is, although the L-data of the object cell should be read out, the level of the bit line that connects with the cell is higher than the bit line reference level VBLR, so as to give rise to the inverted phenomenon of the differential voltage between bit lines. Thereby, an incorrect operation of the sense amplifier is induced. Accordingly, the defective cell can be detected.

For example, in the simulation condition including: the VPP level set to 2.7 V; the VARRAY set to 1.0 V; the VBLR level set to 0.5 V; the capacitance of the object cell set to 0 fF; the capacitance of the counter cell set to 25 fF; and the precharged voltage in the counter cell set to 0.6 V, the inverted phenomenon of the differential voltage of 61 mV occurs. When the inverted phenomenon of the differential voltage occurs, the sense amplifier reliably reads out an "H" so as to enable the detection of the defective cell.

FIG. 11 shows the read out waveforms in the case that the object cell is normal. If the object cell is normal, the data amount (quantity of electric charge) stored in the cell is large enough. For this reason, the level of the bit line that connects with the cell is shifted to the lower value than the bit line reference level VBLR, so as to obtain sufficient differential voltage by which the sense amplifier can correctly read out. In the abovementioned simulation condition, the differential voltage of 80 mV is obtained. Accordingly, it is possible to stably read out the L-data.

After detecting the defective cell through the read out operation described above, in the step S12, the test sequence is left off the test mode of X2 Multi. Subsequently, the Y-address is changed, and then, the test sequence is performed from the step S1. Even if the Y-address reaches the YMAX, the X2=1 word is set to an object word while the X2=0 word is set to a counter word, and then, the test sequence is performed from the step S1. The test for the entire cells through the present invention can be examined after the above procedure.

As is described above, according to the semiconductor memory device of the present invention, the bit line reference level can be arbitrary controlled, the bit line level can be precharged into the counter cell. Alternately, since the word lines of the object cell (test examined cell) and the counter cell can be simultaneously activated, the defective cell can be reliably detected when the defective cell is read out.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor memory device that reads and writes data from and to a plurality of memory cells in a memory cell array by selecting a word line and a bit line comprising:
   a sense amplifier circuit that amplifies a differential voltage between a cell data level read from said bit line and a bit line reference level so as to output said data during reading said data;
   a first circuit that changes said bit line reference level from a predetermined level into a changed level;
   a second circuit that writes said changed level to a second memory cell among said memory cells, a bit line for selecting said second memory cell being commonly connected to a first memory cell; and
   a third circuit that simultaneously activates first and second word lines connected to said first and second memory cells, respectively.

2. The semiconductor memory device as recited in claim 1, wherein:
   said third circuit simultaneously activates said first word line to select as said first memory cell, an object cell which is examined by a test, and said second word line to select as said second memory cell, a counter cell;
   said first circuit generates as said bit line reference level for said test, said changed level higher than said predetermined level; and
   said second circuit writes said changed level in said counter cell.

3. The semiconductor memory device as recited in claim 2, wherein:
   a minimum voltage level is written in said object cell; and
   said first word line and said second word line are simultaneously activated so as to judge said object cell being whether normal or defective.

4. The semiconductor memory device as recited in claim 3, wherein:
   said second circuit writes a 0 V level and a first level in said object cell and said counter cell, respectively, in which said first level has a predetermined level α over a second level with ranging as 0<α< said second level, and said second level corresponds to a half of the highest voltage level that can be written; and
   said first circuit sets said bit line reference level to said second level.

5. The semiconductor memory device as recited in claim 2, wherein said sense amplifier circuit comprising:
   an equalize portion that precharges said bit line with said bit line reference level for said test;
   a sense amplifier portion that amplifies a differential voltage between said bit line and said bit line reference level during reading cell data out; and
   a shared portion that connects or disconnects said equalize portion with or from said sense amplifier portion.

6. The semiconductor memory device as recited in claim 5, wherein:
   said equalize portion writes said bit line reference level for said test in said counter cell when said shared portion disconnects said equalize portion from said sense amplifier portion; and
   when said shared portion connects said equalize portion with said sense amplifier portion, said first word line and said second word line are simultaneously activated so that said sense amplifier portion amplify the differential voltage between the cell data level read to said common bit line and said bit line reference level.

7. The semiconductor memory device as recited in claim 2, wherein:
   said memory cell array is made of a cell arrangement having a quater pitch, in which said cell arrangement repeats in a unit including 4 word lines; and
   said first word line is selected to be addressed as difference of 4 from said second word line.

8. A method of defective cell test according to a semiconductor memory device that reads and writes data from and to a plurality of memory cells in a memory cell array by selecting a word line and a bit line, and comprises a sense amplifier circuit which amplifies a differential voltage between a cell data level read from said bit line and a bit line reference level so as to output data during reading data, said method of defective cell test comprising:

changing said bit line reference level from a predetermined level into a changed level;

writing said changed level to a second memory cell among said memory cells, a bit line for selecting said second memory cell being commonly connected to a first memory cell; and activating simultaneously first and second word lines connected to said first and second memory cells, respectively.

9. The method of defective cell test as recited in claim 8, wherein said writing said changed level to said second memory cell comprises inactivating said sense amplifier circuit.

10. A semiconductor memory device comprising:

a sense amplifier circuit that compares data of a bit line and a reference voltage so as to read data from a memory cell;

a first memory cell to which a first voltage is written;

a second memory cell to which a second voltage is written, wherein said second voltage is opposite from said first voltage against said reference voltage, said fast and second memory cells connect with the same bit line, and said first and second memory cells connect with word lines different from each other; and a third circuit that simultaneously connects said first and second memory cells to the same bit line by simultaneously activating said word lines different from each other based on a test signal, wherein, said third circuit superimposes quantities of electric charge of said first and second memory cells on the same bit line, said sense amplifier circuit reads a voltage of the same bit line.

11. The semiconductor memory device as recited in claim 10, further comprising a second circuit that inactivates said sense amplifier circuit when said second voltage is written to said second memory cell.

12. The semiconductor memory device as recited in claim 11, further comprising a shared portion that connects said sense amplifier circuit to the same bit line, wherein, said shared portion is inactivated when said second voltage is written to said second memory cell.

13. The semiconductor memory device as recited in claim 10, further comprising a first element that applies said second voltage to the same bit line.

14. The semiconductor memory device as recited in claim 13, wherein said sense amplifier circuit inputs said reference voltage for determining memory cell information, and said first element is an element that connects the same bit line to said reference voltage.

15. The semiconductor memory device as recited in claim 14, further comprising a first circuit that changes said reference voltage into said second voltage when said second voltage is written to said second memory cell.

16. The semiconductor memory device as recited in claim 15, further comprising a switch circuit that switches a second reference voltage having the same voltage as said reference voltage to or from a third reference voltage having the same voltage as said second reference voltage by said test signal.

17. The semiconductor memory device as recited in claim 14, further comprising a reference voltage generation circuit that generates said reference voltage, wherein, said first circuit changes a first reference voltage that generates said reference voltage from said reference voltage generation circuit.

18. The semiconductor memory device as recited in claim 10, wherein said third circuit inhibits an arbitrary address bit of an address decoder for selecting said word line based on the test signal.

19. The semiconductor memory device as recited in claim 10, wherein said second voltage is different in an predetermined level $\alpha$ than said reference voltage with ranging as $0<\alpha<$ said reference voltage.

20. The semiconductor memory device as recited in claim 19, wherein said second voltage is different in said predetermined level $\alpha$ than a half of the highest voltage level that can be written with ranging as $0<\alpha<$ said half of the highest voltage level.

* * * * *